# (12) United States Patent
Senoue

(10) Patent No.: US 11,387,128 B2
(45) Date of Patent: Jul. 12, 2022

(54) CHAMBER STRUCTURE

(71) Applicant: HIRATA CORPORATION, Kumamoto (JP)

(72) Inventor: Yusuke Senoue, Kumamoto (JP)

(73) Assignee: HIRATA CORPORATION, Kumamoto (JP)

(*) Notice: Subject to any disclaimer, the term of this patent is extended or adjusted under 35 U.S.C. 154(b) by 142 days.

(21) Appl. No.: 17/043,490

(22) PCT Filed: Mar. 29, 2019

(86) PCT No.: PCT/JP2019/014336
§ 371 (c)(1),
(2) Date: Sep. 29, 2020

(87) PCT Pub. No.: WO2019/189883
PCT Pub. Date: Oct. 3, 2019

(65) Prior Publication Data
US 2021/0111051 A1 Apr. 15, 2021

(30) Foreign Application Priority Data
Mar. 31, 2018 (JP) ............................. JP2018-070476

(51) Int. Cl.
*H01L 21/677* (2006.01)
*H01L 21/265* (2006.01)
(Continued)

(52) U.S. Cl.
CPC ...... *H01L 21/67742* (2013.01); *H01L 21/265* (2013.01); *H01L 21/3065* (2013.01); *H01L 21/67196* (2013.01)

(58) Field of Classification Search
CPC ......... H01L 21/67196; H01L 21/67742; H01L 21/67766; B25J 21/00
See application file for complete search history.

(56) References Cited

U.S. PATENT DOCUMENTS 4,735,548 A * 4/1988 Kimata ............. H01L 21/67766
414/744.3
6,126,381 A * 10/2000 Bacchi .............. H01L 21/67766
414/754
6,242,879 B1 * 6/2001 Sagues .............. H01L 21/67778
901/14

(Continued)

FOREIGN PATENT DOCUMENTS

JP   H11117067 A   4/1999
JP   H11198070 A   7/1999
(Continued)

OTHER PUBLICATIONS

International Search Report (PCT/ISA/210) dated Jun. 25, 2019, by the Japan Patent Office as the International Searching Authority for International Application No. PCT/JP2019/014336.
(Continued)

*Primary Examiner* — Glenn F Myers
(74) *Attorney, Agent, or Firm* — Buchanan Ingersoll & Rooney PC

(57) ABSTRACT

There is provided a chamber structure which greatly facilitates maintenance, such as installation and removal of a transfer robot. In this chamber structure, a transfer robot is attached, via a robot base member, to an opening provided in a base portion of a transfer compartment of a transfer chamber. A robot base member is provided below the opening, and the transfer robot includes a base unit and an arm unit provided on an upper part of the base unit. A robot flange member with the same shape as an opening hole in the robot base member is provided above the base unit. The arm unit is freely insertable through the opening hole, and the robot flange member is detachably connected to a peripheral portion of the opening hole.

7 Claims, 10 Drawing Sheets

(51) Int. Cl.
*H01L 21/3065* (2006.01)
*H01L 21/67* (2006.01)

(56) References Cited

U.S. PATENT DOCUMENTS

| | | | |
|---|---|---|---|
| 6,298,684 B1 | 10/2001 | Mitsuyoshi | |
| 2001/0036398 A1* | 11/2001 | Hofmeister | B25J 9/06 414/744.1 |
| 2004/0261944 A1 | 12/2004 | Wakabayashi et al. | |
| 2005/0036877 A1 | 2/2005 | Ogawa et al. | |
| 2012/0128450 A1 | 5/2012 | Caveney et al. | |
| 2013/0269465 A1 | 10/2013 | Furukawa et al. | |

FOREIGN PATENT DOCUMENTS

| | | |
|---|---|---|
| JP | H11354603 A | 12/1999 |
| JP | 2000-216218 A | 8/2000 |
| JP | 2000216218 A | 8/2000 |
| JP | 2000260850 A | 9/2000 |
| JP | 2001035902 A | 2/2001 |
| JP | 4903728 B2 | 3/2012 |
| JP | 2012195336 A | 10/2012 |
| JP | 2013126707 A | 6/2013 |
| TW | 200400583 A | 1/2004 |
| TW | 201233511 A | 8/2012 |
| TW | 201328838 A | 7/2013 |
| WO | 03/088335 A1 | 10/2003 |

OTHER PUBLICATIONS

Written Opinion (PCT/ISA/237) dated Jun. 25, 2019, by the Japan Patent Office as the International Searching Authority for International Application No. PCT/JP2019/014336.
Office Action dated May 3, 2021, in corresponding Taiwanese Patent Application No. 108110855. (10 pages).

* cited by examiner

CHAMBER STRUCTURE

TECHNICAL FIELD

The present invention relates to a chamber structure including an internal space in which a transfer robot is installed, and in more detail to a chamber structure connected to a processing apparatus for ion implantation, etching, or the like during manufacturing of substrates, such as semiconductor substrates.

BACKGROUND ART

In the manufacturing process of substrates, such as semiconductor substrates, processing such as ion implantation and etching is performed on a substrate inside a processing apparatus via a transfer chamber which is internally maintained at a vacuum. The transfer of workpieces, such as substrates, into and out of the processing apparatus is performed by a transfer robot attached to the transfer chamber. That is, a transfer robot is installed in an internal space (or "transfer compartment") inside the transfer chamber that is airtight and can be placed in a high vacuum.

CITATION LIST

Patent Literature

Patent Literature 1 Japanese Patent No. 4,903,728

SUMMARY OF INVENTION

Technical Problem

Consider a case where a transfer robot is newly installed in a transfer chamber or a case where a transfer robot in a transfer chamber is removed for maintenance or the like. As one example, when a transfer robot inside a transfer chamber is removed, first, the transfer robot is dismantled in the up-down direction inside the transfer chamber into a base unit and an arm unit, which is provided on an upper portion of the base unit. After this, the arm unit, which is the upper of the dismantled parts, is removed from an upper side of the transfer chamber, and the base unit, which is the lower of the dismantled parts, is removed out from a lower side of the transfer chamber.

Also, when installing a transfer robot into a transfer chamber, it is necessary to perform the procedure described above in the reverse order.

To minimize the time taken to reach the desired degree of vacuum in the transfer chamber, which is used in an evacuated state, it is common to provide only the minimum amount of space for the transfer robot to fit inside the chamber. This means that the task of attaching and detaching the transfer robot to and from the transfer chamber where the transfer robot is installed cannot be easily performed by the operator in a comfortable posture. In other words, the task of attaching and detaching a transfer robot, and in particular the task of dismantling the transfer robot, has to be performed in a narrow space in which the operator's hands can barely fit. This forces the operator to use a cramped posture.

With a conventional apparatus, the upper arm unit of the dismantled transfer robot is removed into a work space provided above the transfer chamber using a crane or the like, which means that a work space for performing this task needs to be provided above the transfer chamber (See FIG. 2 of Patent Literature 1).

However, the space above a transfer chamber tends to be used as a space for installing various devices and apparatuses used for purposes such as quality control of products. This means that it is difficult to provide a sufficient upper space, which makes the above task even more difficult.

As described above, there has been a problem of increasing difficulty for the task of installing and removing a transfer robot into and from a transfer chamber and for maintenance work on a transfer robot.

The present invention was conceived in view of the problems described above, and it is an object of the present invention to provide a chamber structure in which a transfer robot is installed and which facilitates maintenance tasks, such as installation and removal of the transfer robot.

Solution to Problem

The present invention is a chamber structure in which a transfer robot is attached, via a ring-shaped robot base member and a robot flange member, to an opening provided in a base portion of a transfer compartment, which is an internal space of a transfer chamber, wherein the robot base member is provided below the opening in the transfer chamber, the transfer robot includes a base unit and an arm unit provided on an upper portion of the base unit, the robot flange member, which has a same shape as an opening hole of the robot base member, is provided on an upper side of the base unit, the arm unit is freely insertable through the opening hole, and the robot flange member is detachably connected to a peripheral portion of the opening hole.

The robot flange member may be movable from a flange attachment position, where the arm unit is installed in the transfer compartment, to a flange removal position, where the arm unit has been removed from the transfer compartment through the opening hole, and the robot flange member may be movable from the flange removal position to the flange attachment position with the arm unit passing through the opening hole and being set in the transfer compartment.

The robot base member may include an outer peripheral portion to be attached to the transfer chamber, an inner peripheral wall formed inside the outer peripheral portion, and the opening hole formed inside the inner peripheral wall, and a tubular space defined by extending an inner peripheral edge of the inner peripheral wall upward may correspond to a turning area of the arm unit of the transfer robot installed in the transfer compartment.

The opening hole may be disposed inside the inner peripheral edge of the inner peripheral wall, and the robot base member may include a base surface portion that constructs a base portion of the transfer compartment, between the inner peripheral edge of the inner peripheral wall and the opening hole.

The robot base member may be equipped with an attachment hole, which is used for attachment to the transfer chamber, in the outer peripheral portion, and may be equipped with an attachment hole, which is used for attachment of the robot flange member, in the base surface portion.

The robot flange member may be equipped with a ring-shaped base body, to which the base unit of the transfer robot is to be attached, and a flange portion disposed on an upper side of the base body, the base body may be equipped with a hollow portion through which a connecting portion of the arm unit of the transfer robot that connects to the base unit is inserted, and the flange portion may include an outer peripheral portion, which has a plurality of attachment holes used for attachment to the robot flange member, and a sealing member attachment channel disposed further inside than the attachment holes.

The base body may be equipped with attachment holes, which are used for attaching the base unit of the transfer robot, on a lower end surface thereof, and the attachment holes may be disposed further inside than the sealing member attachment channel.

Advantageous Effects of Invention

The chamber structure according to the present invention makes it possible, when a transfer robot is installed in the transfer chamber or a transfer robot is removed from the transfer chamber, to install or remove the transfer robot with the transfer robot in an assembled state without being dismantled into upper and lower parts and by performing access from below the transfer chamber only.

BRIEF DESCRIPTION OF DRAWINGS

FIG. 1 is a perspective view depicting a state where a chamber structure according to an embodiment is seen from above.

FIG. 2 is a perspective view depicting a state where the chamber structure depicted in FIG. 1 is seen from below.

FIG. 3 is a front view depicting the chamber structure depicted in FIG. 1.

FIG. 4 is an explanatory side view depicting a cross section along a line A-A of a principal part of the chamber structure depicted in FIG. 1.

FIG. 5 is a perspective view depicting a robot base member and a robot flange member when looking from above.

FIG. 6 is a perspective view depicting the robot base member and the robot flange member when looking from below.

FIG. 7 is an explanatory view depicting a state where a transfer robot, which has been positioned below a robot base member fixed to a transfer chamber, is seen from above.

FIG. 8 is an explanatory view depicting a state where the transfer robot, which has been positioned below the robot base member fixed to the transfer chamber, is seen from below.

FIG. 9 is an explanatory view depicting a state midway during attachment or removal of a transfer robot to or from a robot base member fixed to a transfer chamber.

FIG. 10 is an explanatory view depicting a transfer robot that has been attached to a robot base member fixed to a transfer chamber.

REFERENCE SIGNS LIST

1—transfer chamber,
11—ceiling portion,
11a—door (ceiling lid),
11b—connecting portion at one end,
11c—connecting portion at other end,
12—side portion,
13—base portion, 13a—opening, 13b—lower surface,
20—robot base member (robot base portion),
21—outer peripheral portion (wall portion),
21a—upper end surface, 21b—attachment hole,
21c—attachment screw, 21d—outer peripheral surface,
21e—inner peripheral surface, 22—base surface portion,
22a—opening hole, 22c—attachment screw,
3—transfer robot, 31—base unit, 32—arm unit,
33—robot flange member (robot flange portion),
33a—base body, 33b—flange portion,
33c—inner peripheral surface, 33d—attachment hole,
33e—attachment/detachment hole,
33f—outer peripheral portion,
33g—channel (sealing member attachment channel),
33h—attachment/detachment screw,
41, 42—pair of arms, 41a and 42a—first arms,
41b and 42b—second arms, H—fixture H, M—module,
S—tubular space, W1—maximum diameter of arm unit,
W2—inner diameter of inner peripheral surface

DESCRIPTION OF EMBODIMENTS

Next, a chamber structure according to the present invention will be described with reference to the drawings.

Figure 1:
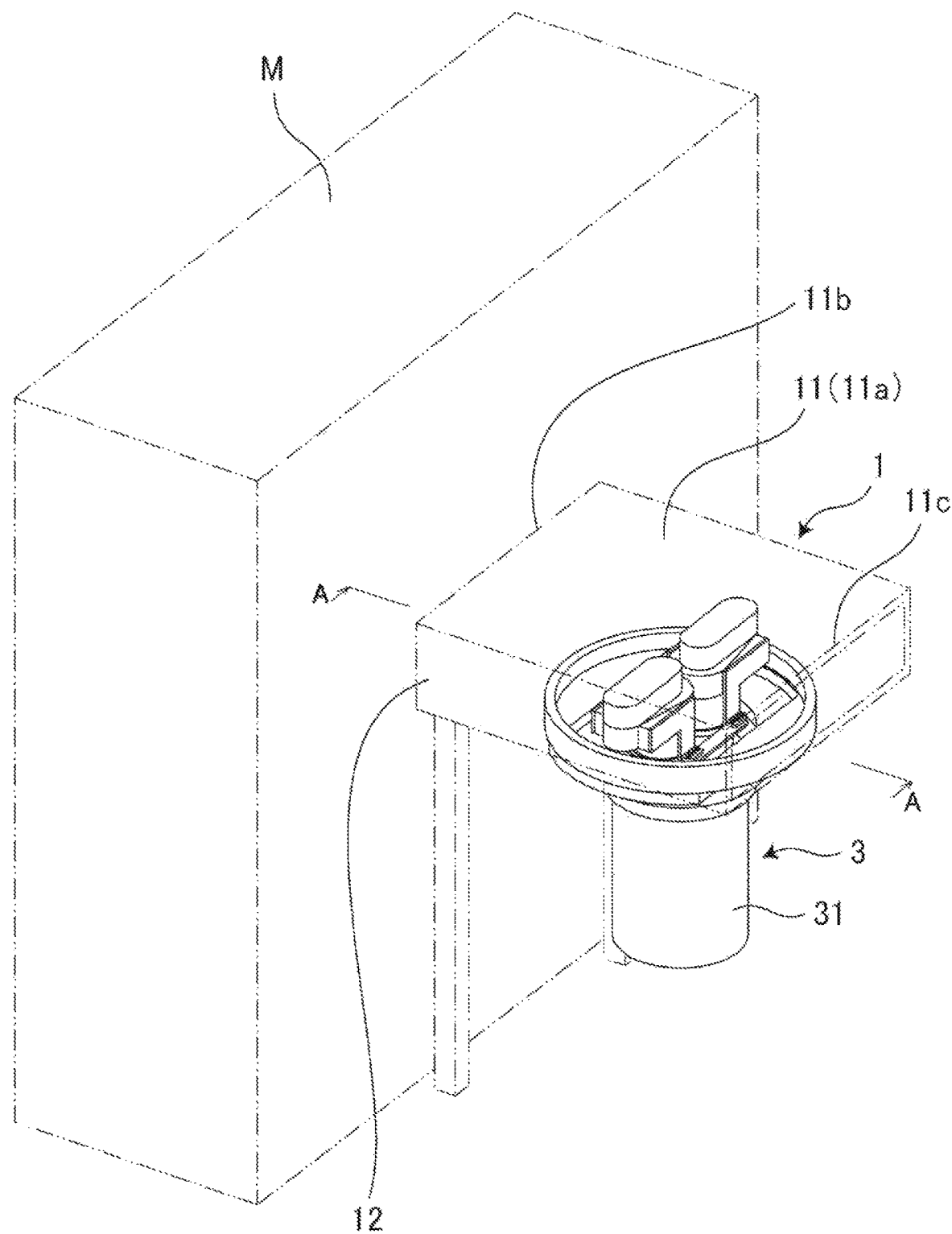
FIG. 1
Figure 2:
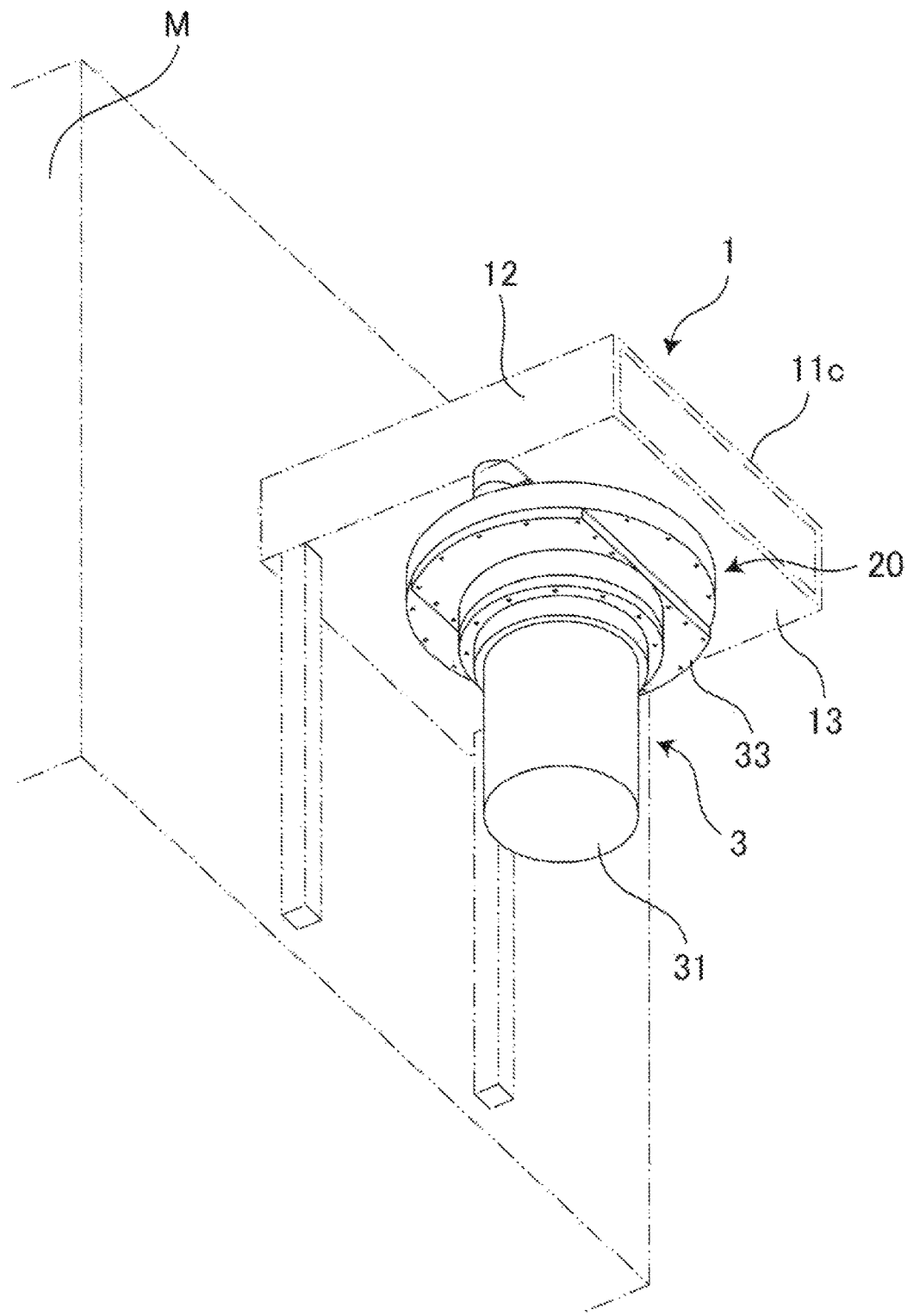
FIG. 2
Figure 3:
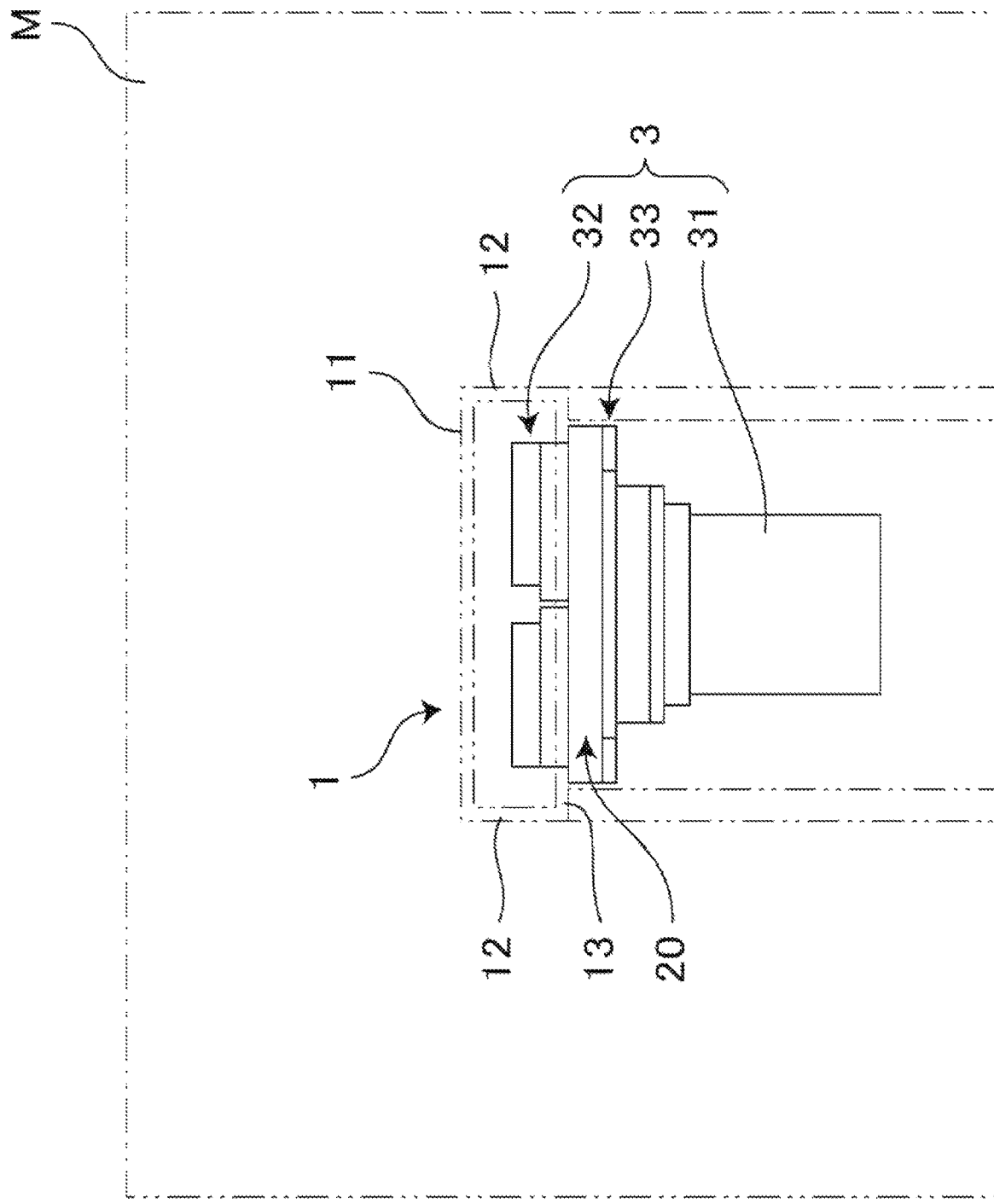
FIG. 3

As depicted in FIGS. 1 to 3, a transfer chamber 1 is installed in a state where one end is connected to a module M for used for semiconductors, such as an EFEM (Equipment Front End Module).

The other end of the transfer chamber 1 (the opposite end to the module M end) is connected to a processing device (not depicted) that performs an etching process or the like, a load lock chamber, or the like.

Since these configurations are well known, detailed description is omitted here.

The transfer chamber 1 is internally provided with a space in which part of the transfer robot 3 is disposed, and has a rectangular structure including a ceiling portion 11, a side portion 12, and a base portion 13.

The ceiling portion 11 is provided with a ceiling lid (or "door") 11a that slides open and closed with respect to an upper opening of the transfer chamber 1, but is not described in detail here.

A gate valve (not depicted) is provided at one end 11b of the transfer chamber 1 that is connected to the module M, and another gate valve (not depicted) is provided at the other end 11c that is connected to a processing apparatus or the like.

By closing the openable ceiling lid 11a and the gate valves at both ends 11b and 11c, the internal space of the transfer chamber 1 is made airtight, and by evacuating the internal space of the transfer chamber 1 using a vacuum pump, a high vacuum is produced.

Note that since gate valves, vacuum pumps, and the like are well-known technologies, the configurations used here have been omitted from the description and the drawings.

Figure 4:
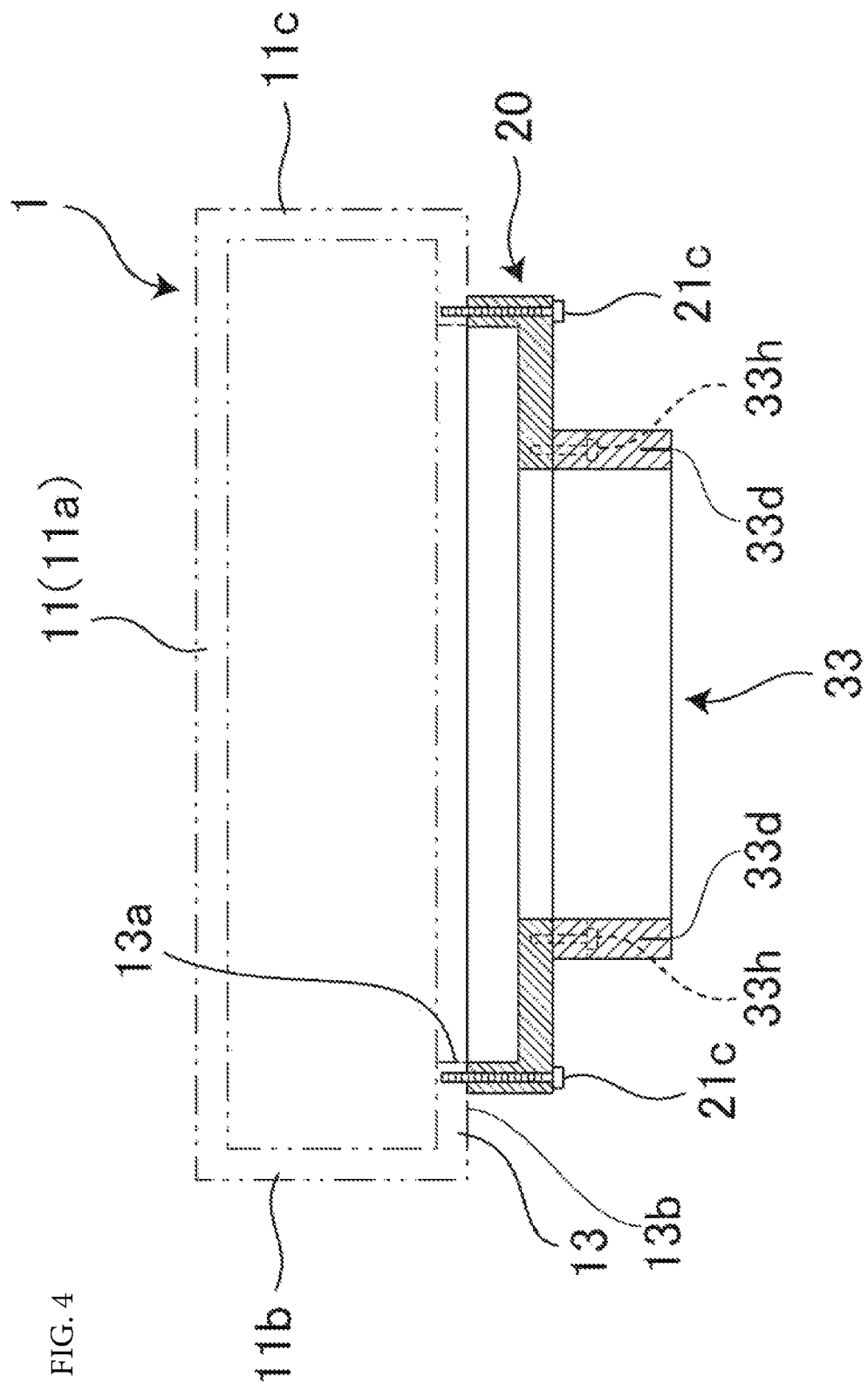
FIG. 4

As depicted in FIG. 4, the transfer chamber 1 has an opening 13a provided in the base portion 13.

A robot base portion 20 (hereinafter, "robot base member") is attached to the base portion 13. In more detail, the robot base member 20 is disposed below the opening 13a of the base portion 13 of the transfer chamber 1 so as to surround the opening 13a, and is fixed to the lower surface 13b of the base portion 13.

When the arm unit 32, described later, of the transfer robot 3 is installed inside the transfer chamber 1, the transfer robot 3 is fixed to this robot base member 20. In more detail, a robot flange member 33, described later, provided on the transfer robot 3 is fixed to the robot base member 20. By doing so, only the arm unit 32 of the transfer robot 3 is housed inside the internal space of the transfer chamber 1. In the transfer robot 3 installed in the transfer chamber 1, the maximum turning diameter of the arm unit 32 is limited to the inner diameter of the internal space of the transfer chamber 1 or less.

Figure 5:
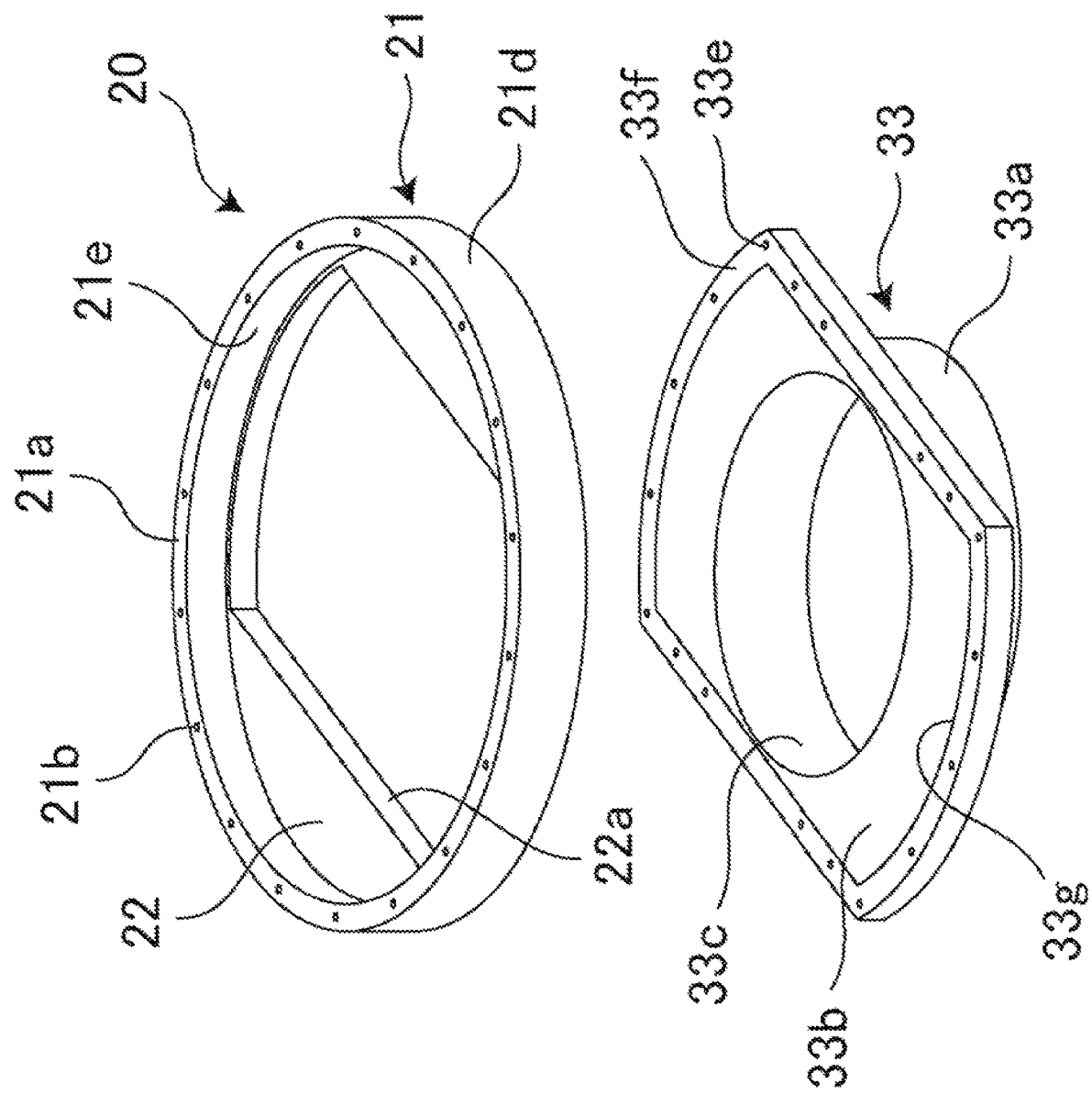
FIG. 5
Figure 6:
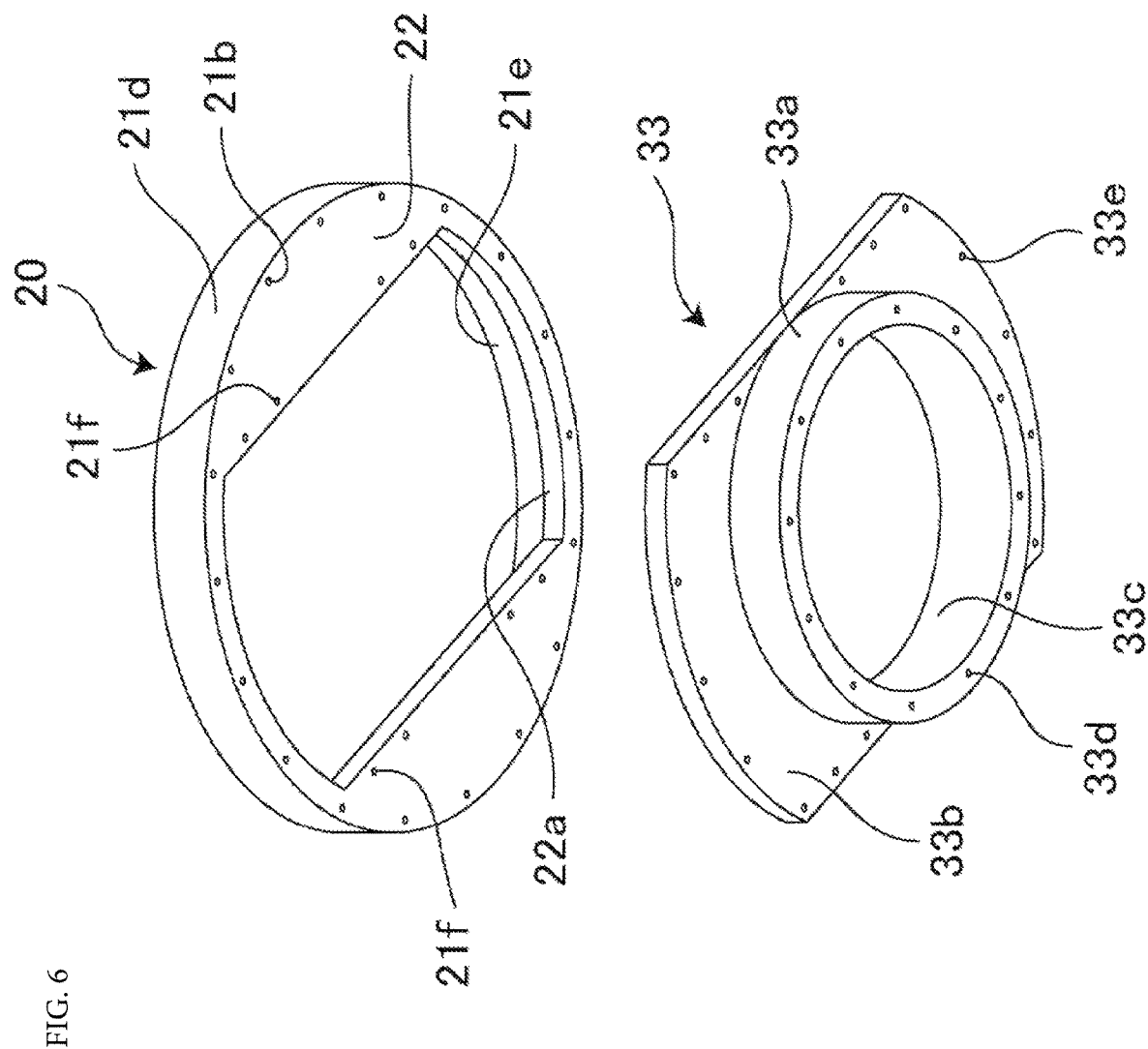
FIG. 6

As depicted in FIGS. 5 and 6, the robot base member 20 includes a ring-shaped outer peripheral portion 21 which is attached to the transfer chamber 1. The robot base member 20 can be regarded as an annular (or tubular) member.

The outer peripheral portion 21 is constructed of a ring-shaped wall portion and has a ring-shaped upper end surface 21a formed on the upper side of the outer peripheral portion (wall portion) 21. The upper end surface 21a contacts the lower surface 13b of the base portion 13 of the transfer chamber 1 when the robot base member 20 is fixed to the transfer chamber 1.

A plurality of attachment holes 21b used for attaching the robot base member 20 to the transfer chamber 1 are formed in the outer peripheral portion 21. Note that since attachment screws 21c (see FIG. 4) used for attachment are a well-known configuration, detailed description thereof is omitted.

The outer peripheral portion 21 of the robot base member 20 is equipped with an outer peripheral surface 21d formed on its outside and an inner peripheral surface 21e formed on its inside.

The inner peripheral surface 21e is formed in a tubular shape. When the robot base member 20 is installed in the transfer chamber (transfer compartment) 1, a tubular space S (see FIG. 7) that has the inner peripheral surface 21e as the internal dimension and is drawn as extending upward defines a maximum dimension W1 of the arm unit 32 in a storage position (described later) set in the transfer chamber 1. Note that the tubular inner peripheral surface 21e is circular when the robot base member 20 is seen in plan view. Accordingly, the maximum dimension W1 of the arm unit 32 in the storage state set in the transfer chamber 1 is limited to the internal dimension W2 of the inner peripheral surface 21e or below.

In a state where the robot base member 20 is fixed to the transfer chamber 1, the base surface portion 22 of the robot base member 20 forms part of the base portion 13 of the transfer chamber 1. An opening hole 22a is formed in the base surface portion 22 of the robot base member 20.

In the present embodiment, the opening hole 22a is an oval-shaped opening whose circumference is formed by a pair of outwardly convex arcs and a pair of straight lines. The pair of arcs are formed so as to be substantially flush with the inner peripheral surface 21e of the robot base member 20.

Attachment holes 21f used for attaching a robot flange portion 33 (hereinafter, "robot flange member") of the transfer robot 3 described below are formed at the peripheral edge of the opening hole 22a in the lower surface of the base surface portion 22. Note that since attachment screws 33h (see FIG. 4) used for this attachment are a well-known configuration, detailed description thereof is omitted.

Figure 7:
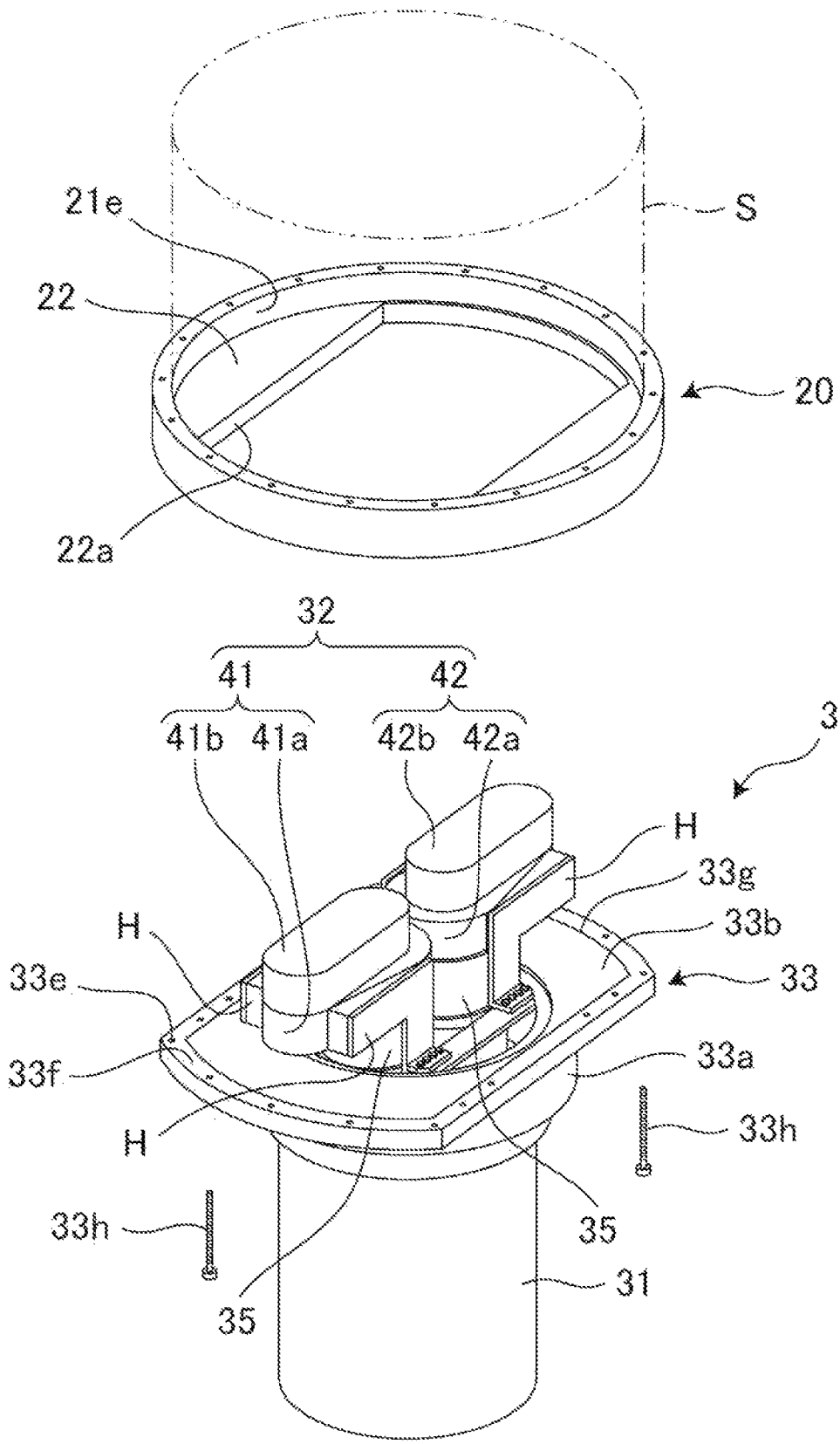
FIG. 7

As depicted in FIG. 7, the transfer robot 3 includes a base unit 31 with a built-in drive motor and the like, the arm unit 32 provided on an upper portion of the base unit 31, and the robot flange member 33 used to attach the transfer robot 3.

As will be described later, the transfer robot 3 that is related to the chamber structure of this embodiment is attached to the transfer chamber 1 by fixing the robot flange member 33 to the robot base member 20 and simultaneously disposing the arm unit 32 of the transfer robot 3 inside the transfer chamber 1. Note that since the base unit 31 of the transfer robot 3 has a well-known configuration, detailed description thereof is omitted here.

The arm unit 32 is equipped with a pair of arms 41 and 42. Each of the arms 41 and 42 has a first arm 41a or 42a whose base end is fixed to the base unit 31, and a second arm 41b or 42b attached to the front end of the first arm.

Note that end effectors (or "hands", not depicted) for holding the workpiece to be transferred are attached to the front ends of the second arms 41b and 42b. The end effectors are freely detachable from the second arms 41b and 42b.

The first arms 41a and 42a and the second arms 41b and 42b of the two arms 41 and 42 that construct the arm unit 32 are rotatably attached. As depicted in FIG. 7, both arms 41 and 42 are folded into a storage position that is suitable for attaching and detaching the transfer robot 3 and for transportation. It should be obvious that when a workpiece is being transferred by the transfer robot 3, both arms 41 and 42 are capable of extending and folding by controlling how the first arms 41a and 42a and the second arms 41b and 42b respectively rotate.

In the arm unit 32 of the present embodiment, in the storage position, the first arms 41a and 42a and the second arms 41b and 42b of the respective arms 41 and 42 overlap in the up-down direction, and the first arms 41a and 42a of both arms 41 and 42 are disposed back to back so as to face in opposite directions. Both arms 41 and 42 are completely enclosed within the inner dimension of the inner peripheral surface 21e. When both arms 41 and 42 of the arm unit 32 are positioned at this position, the arm unit 32 can be easily handled during maintenance work on the transfer chamber 1 or the transfer robot 3.

Note that both arms 41 and 42 that have been positioned in the storage position can be fixed in this folded state using a fixture H. Fixing both arms 41 and 42 at the storage position using the fixture H facilitates handling of the transfer robot 3 at the time of attachment, detachment, and maintenance of the transfer robot 3.

In addition, the arm unit 32 with both arms 41 and 42 positioned at the storage position is in a compactly folded state and, as described later, can be inserted through the opening hole 22a of the robot base member 20.

Note that out of the configuration of the arm unit 32, detailed description of well-known configurations aside from those described above is omitted.

The robot flange member 33 is a component that is detachably attached to the robot base member 20 when attaching the transfer robot 3 to the transfer chamber 1. As depicted in FIG. 7, the robot flange member 33 is disposed at a position which is above the base unit 31 of the transfer robot 3 but is below the arm unit 32.

The robot flange member 33 is equipped with a ring-shaped (or tubular) base body 33a and a flange portion 33b that extends radially from the upper end of the base body 33a (see FIGS. 5 and 6). The base body 33a has an internal space (hollow portion) surrounded by an inner peripheral surface 33c.

The base body 33a is a part to which the base unit 31 of the transfer robot 3 is attached.

The base body 33a is provided with attachment holes 33d on its lower end surface, which are used for attachment to the base unit 31. It is preferable for the attachment holes 33d to be disposed further to the inside in the radial direction of the inner peripheral surface 33c than a channel (sealing member attachment channel) 33g, described later. Note that since the attachment screws (not illustrated) used for attachment of the base unit 31 are a well-known configuration, detailed description thereof is omitted. When the base unit 31, the robot flange member 33, and the arm unit 32 are integrally assembled to produce the transfer robot 3, the inner peripheral surface 33c of the base body 33a is the part that becomes connected to both the arms 41 and 42 and the base unit 31 and through which the drive units 35 and 35 that drive the arms 41 and 42 are inserted. Both arms 41 and 42 are swiveled and moved up and down by the drive units 35 and 35.

In this way, in the chamber structure according to the present embodiment, the transfer robot 3 installed in the transfer chamber 1 is produced by integrally assembling the base unit 31, the arm unit 32, and the robot flange member 33 as depicted in FIG. 7.

The flange portion 33b of the robot flange portion is attached to the robot base member 20 when the transfer robot 3 is installed in the transfer chamber 1. The outer shape of the flange portion 33b is an oval composed of a pair of outwardly convex arcs and a pair of straight lines, and has almost the same shape as the opening hole 22a in the robot base member 20.

That is, when the robot flange member 33 is attached to the robot base member 20, an outer peripheral edge portion of the upper surface of the flange portion 33b comes into contact with the peripheral edge of the opening hole 22a in the lower surface of the robot base member 20, so that the opening hole 22a of the robot base member 20 becomes covered by the robot flange member 33.

The flange portion 33b includes an outer peripheral portion 33f provided with a plurality of attachment/detachment holes 33e used for attachment on the robot flange member 33 and a channel (sealing member attachment channel) 33g disposed to the inside of the attachment/detachment holes 33e. A sealing member, such as an O-ring (not illustrated), is attached to the channel 33g. This means that even when the robot flange member is freely detachable from the robot base member, it is still possible to ensure that the chamber is airtight when the robot flange member is attached.

Note that since the attachment/detachment screws 33h for attaching the robot flange member 33 to the robot base member 20 are a well-known configuration, detailed description thereof is omitted.

Next, the procedure of attaching and detaching a transfer robot in the chamber structure of the present embodiment will be described.

First, the transfer robot 3 will be described.

As described earlier, the transfer robot 3 attached to and detached from the chamber structure according to the present embodiment is produced by integrally assembling the base unit 31, the arm unit 32, and the robot flange member 33 of the transfer robot 3 (see FIG. 7).

With the chamber structure according to the present embodiment, the transfer robot 3 produced by integrally assembling the base unit 31, the arm unit 32, and the robot flange member 33 can be installed in the transfer chamber 1 in the assembled state and by performing access from the lower side only. That is, according to the chamber structure of the present embodiment, when the transfer robot 3 is installed inside the transfer chamber 1, the transfer robot 3 can be attached from the lower side of the transfer chamber 1 in an integrally assembled state without being dismantled into the base unit 31, the arm unit 32, and the robot flange member 33. It should be obvious here that the arm unit 32 of the transfer robot 3 can be inserted through the opening hole 22a of the robot base member 20 in an integrally assembled state.

As depicted in FIGS. 1 and 2, by installing the transfer robot 3 in the transfer chamber 1, the robot flange member 33 becomes attached to the lower surface side of the robot base member 20, the arm unit 32 becomes housed inside the transfer chamber 1, and the base unit 31 becomes disposed below (that is, outside) the transfer chamber 1. After this, the door 11a of the transfer chamber 1 is opened, and end effectors (not illustrated) are attached to the second arms 41b and 42b, respectively.

An example procedure for removing a transfer robot 3 that has been installed in a transfer chamber 1 from the transfer chamber 1 will be described.

Figure 10:
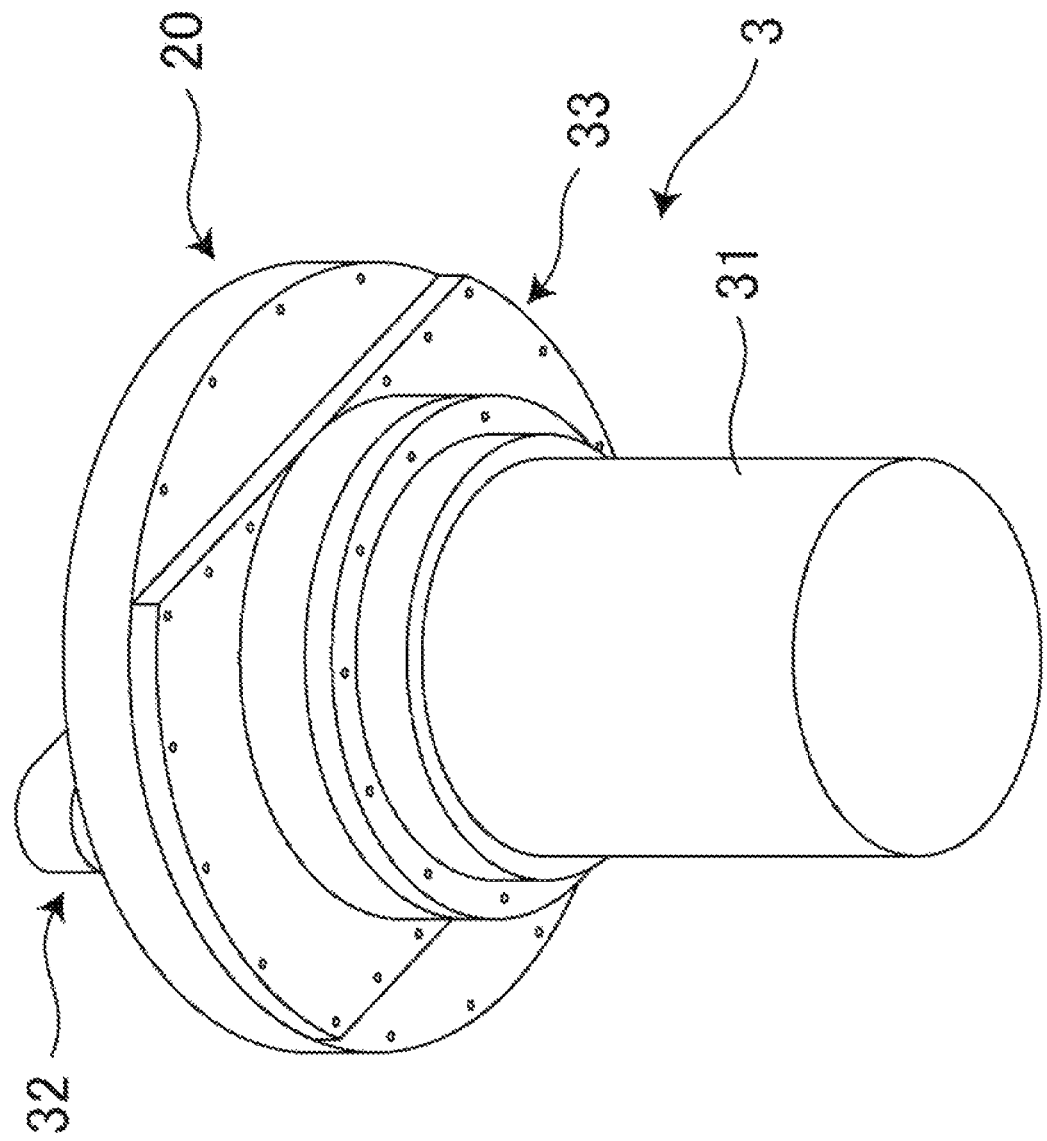
FIG. 10

First, out of the transfer chamber 1 and the transfer robot 3 in the connected state depicted in FIGS. 3 and 10, the robot flange member 33 attached to the robot base member 20 is removed from the robot base member 20 (flange removal step). Note that although the transfer chamber 1 has not been drawn in FIG. 10, the robot base member 20 is actually fixed to the lower surface of the transfer chamber 1.

Figure 8:
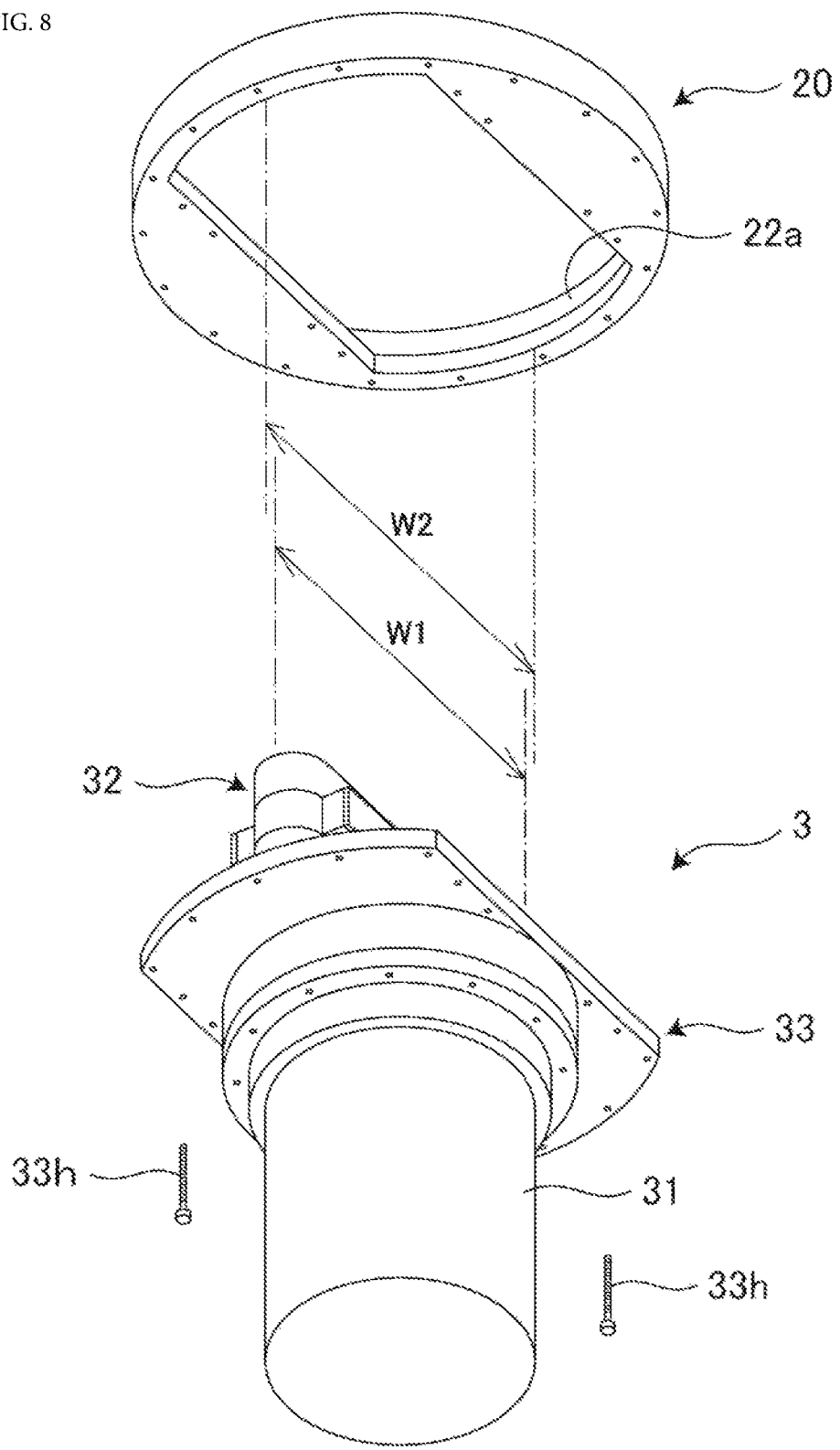
FIG. 8
Figure 9:
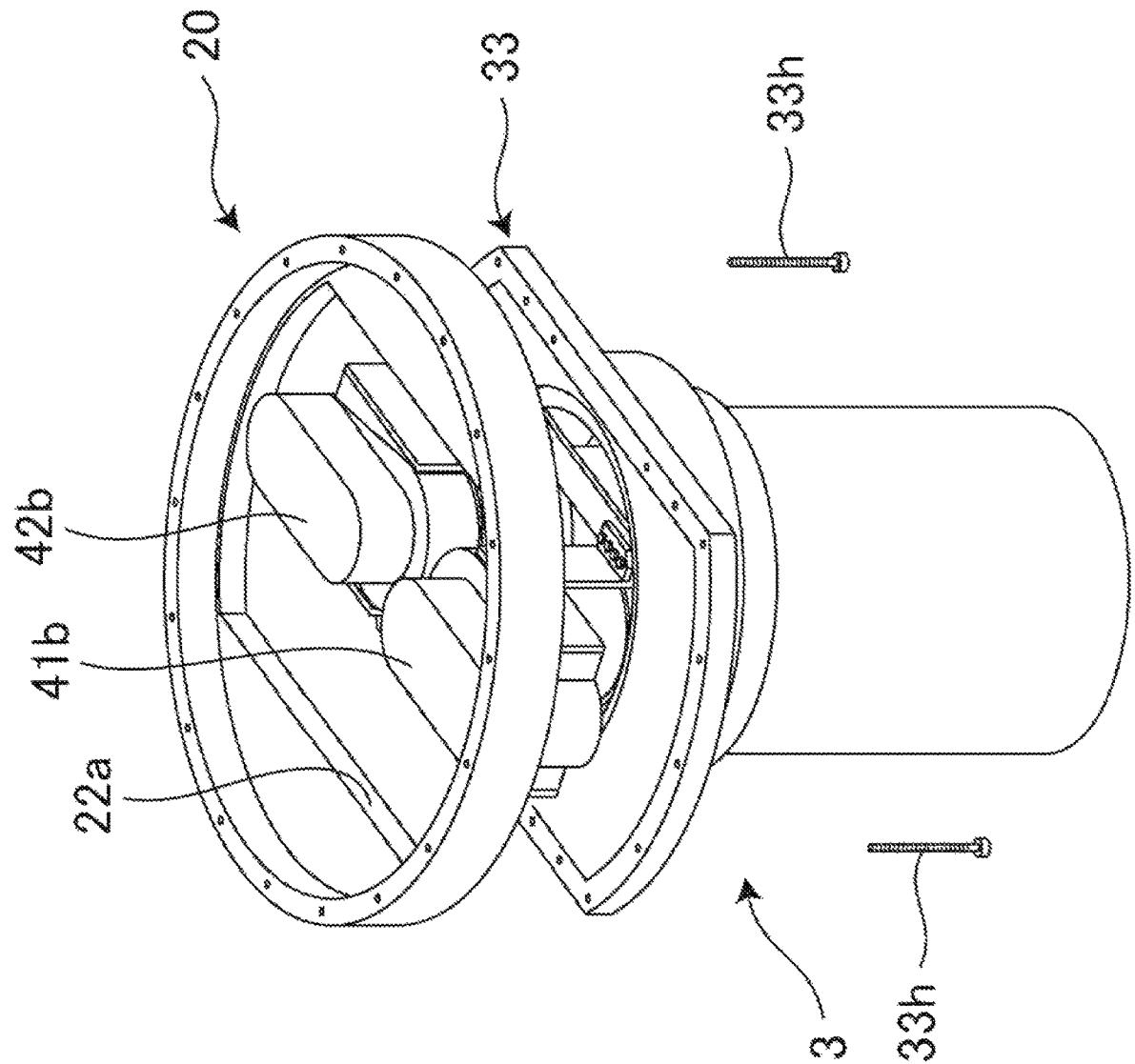
FIG. 9

In more detail, first, the attachment screws 33h (see FIG. 4) that are fixed to the robot base member 20 are removed from the lower side of the robot flange member 33. By doing so, as depicted in FIGS. 8 and 9, it becomes possible to lower and remove the entire transfer robot 3 below the robot base member 20 together with the robot flange member 33 in a state where the robot base member 20 is still fixed to the transfer chamber 1. Note that the transfer chamber 1 has also been omitted from FIGS. 8 and 9.

As described earlier, since both arms 41 and 42 of the arm unit 32 are positioned in the storage position and are located in a range surrounded by the edge of the opening hole 22a, it is possible for the arm unit 32 to pass through the opening hole 22a in its assembled state.

Accordingly, when the robot flange member 33 is lowered, as depicted in FIG. 9, the arm unit 32 of the transfer robot 3 at the attachment position passes from inside the transfer chamber 1 through the opening hole 22a. After this, as depicted in FIGS. 7 and 8, the transfer robot 3 is removed outside (i.e., moved below) the transfer chamber 1 ("flange removal position").

The transfer robot 3 can be attached to the transfer chamber 1 by executing the processes described above in the reverse order.

In this way, according to the chamber structure of the present embodiment, the transfer robot 3 can be attached to and detached from the transfer chamber 1 with the base unit 31 and the arm unit 32 integrally assembled.

As described earlier, although the internal space of the transfer chamber 1 in which the arm unit 32 of the transfer robot 3 is installed is narrow, the chamber structure of the present embodiment makes it possible to install and remove the transfer robot 3 in and out of the transfer chamber 1 with the transfer robot 3 in its assembled state by performing access from below only. This means that even if the internal space of the transfer chamber 1 is narrow, there is hardly any effect on the ease of maintenance tasks. That is, when installing or removing the transfer robot 3, it is not necessary to remove the arm unit 32 from the base unit 31 inside the transfer chamber 1 and perform a task that removes only the arm unit 32 from the transfer chamber 1.

Also, in the chamber structure according to the present embodiment, the opening hole 22a of the robot base member 20 is sized so as to allow the arm unit 32 of the transfer robot 3 at the storage position to pass through. This means that by merely removing the robot flange member 33, which is integrated with the transfer robot 3, from the robot base member 20 and lowering the robot flange member 33, it is possible to downwardly remove the entire transfer robot 3 from the transfer chamber 1. That is, the transfer robot 3 can be attached to and detached from the transfer chamber 1 with favorable maintenance characteristics, regardless of the size of the internal space of the transfer chamber 1.

Also, even when a variety of apparatuses are installed in a space above the chamber structure 1 of the present embodiment, it is still possible to install the transfer robot 3 in the transfer chamber 1 and to remove the transfer robot 3 by performing access from only the lower side of the transfer chamber 1. Accordingly, the chamber structure according to the present embodiment makes it possible to stably install and remove the transfer robot 3 in and from the transfer chamber 1 without being affected by the surrounding environment of the transfer chamber 1.

INDUSTRIAL APPLICABILITY

The chamber structure according to the present invention can be applied, as one example, to a chamber structure connected to a processing apparatus for a process such as ion implantation or etching during manufacturing of semiconductor substrates.

The invention claimed is:

1. A chamber structure in which a transfer robot is attached, via a robot base portion and a robot flange portion, to an opening provided in a base portion of a transfer compartment, which is an internal space of a transfer chamber,
wherein the robot base portion is provided below the opening in the transfer chamber,
the transfer robot includes a base unit and an arm unit provided on an upper portion of the base unit,
the robot flange portion, which has a same shape as an opening hole of the robot base portion, is provided on an upper side of the base unit,
the arm unit is freely insertable through the opening hole, and
the robot flange portion is detachably connected to a peripheral portion of the opening hole.

2. A chamber structure according to claim 1,
wherein the robot flange portion is movable from a flange attachment position, where the arm unit is installed in the transfer compartment, to a flange removal position, where the arm unit has been removed from the transfer compartment through the opening hole, and the robot flange portion is movable from the flange removal position to the flange attachment position with the arm unit passing through the opening hole and being set in the transfer compartment.

3. A chamber structure according to claim 1,
wherein the robot base portion includes a ring-shaped outer peripheral portion to be attached to the transfer chamber, an inner peripheral wall formed inside the outer peripheral portion, and the opening hole formed inside the inner peripheral wall, and
a tubular space defined by extending an inner peripheral edge of the inner peripheral wall upward corresponds to a turning area of the arm unit of the transfer robot installed in the transfer compartment.

4. A chamber structure according to claim 3,
wherein the opening hole is disposed inside the inner peripheral edge of the inner peripheral wall, and
the robot base portion includes a base surface portion that constructs a base portion of the transfer compartment, between the inner peripheral edge of the inner peripheral wall and the opening hole.

5. A chamber structure according to claim 3,
wherein the robot base portion is equipped with an attachment hole, which is used for attachment to the transfer chamber, in the outer peripheral portion, and is equipped with an attachment hole, which is used for attachment of the robot flange portion, in the base surface portion.

6. A chamber structure according to claim 1,
wherein the robot flange portion is equipped with a ring-shaped base body, to which the base unit of the transfer robot is to be attached, and a flange portion disposed on an upper side of the base body,
the base body is equipped with a hollow portion through which a connecting portion of the arm unit of the transfer robot that connects to the base unit is inserted, and
the flange portion includes an outer peripheral portion, which has a plurality of attachment holes used for attachment to the robot flange portion, and a sealing member attachment channel disposed further inside than the attachment holes.

7. A chamber structure according to claim 6,
wherein the base body is equipped with attachment holes, which are used for attaching the base unit of the transfer robot, on a lower end surface thereof, and
the attachment holes are disposed further inside than the sealing member attachment channel.

* * * * *